Dec. 4, 1956 E. H. HUGENHOLTZ 2,773,188
AUTOMATIC FREQUENCY CONTROL
Filed Sept. 25, 1952
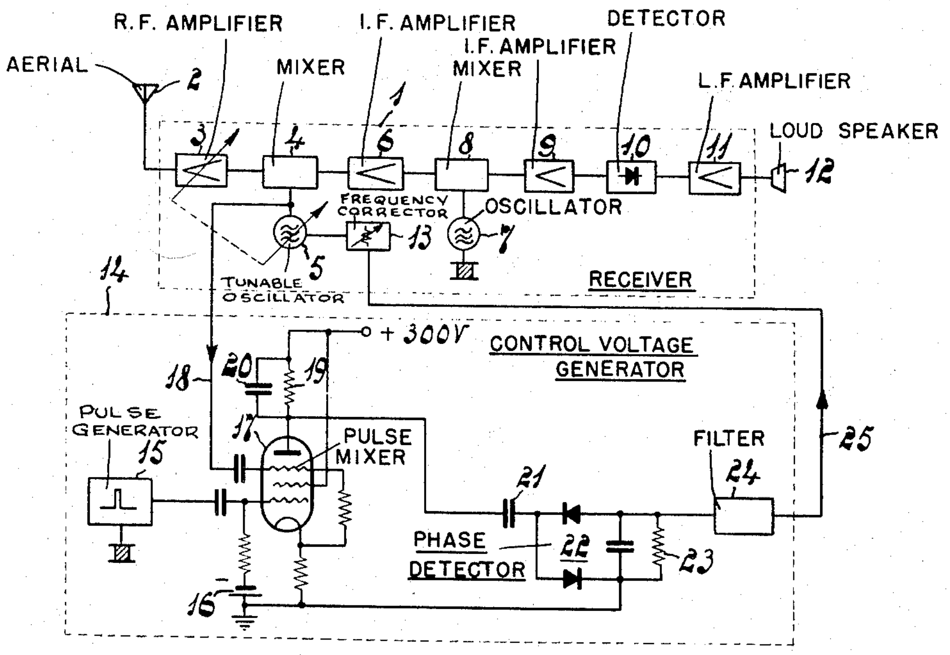
INVENTOR
EDUARD HERMAN HUGENHOLTZ
BY Fred M Vogel AGENT 2,773,188

AUTOMATIC FREQUENCY CONTROL

Eduard Herman Hugenholtz, Hilversum, Netherlands, assignor to Hartford National Bank and Trust Company, Hartford, Conn., as trustee Application September 25, 1952, Serial No. 311,421

Claims priority, application Netherlands October 17, 1951

3 Claims. (Cl. 250—36)

The present invention concerns oscillator tuning circuit arrangements. More particularly, the invention relates to an oscillator provided with a frequency corrector which is governed by means of a control-voltage for automatic stabilization of the frequency of the oscillator oscillations with respect to stabilizing pulses. The control-voltage is derived from a control-voltage generator comprising a normally cut-off pulse mixing stage, in which the oscillator voltage to be stabilized is mixed with stabilizing pulses periodically releasing the mixing stage.

In devices comprising oscillators stabilized by pulses, a control-voltage occurs across the output circuit of the pulse mixing stage, for example, across a network integrating the output pulses, this control voltage being suitable to accurately control the oscillator frequency, by means of the frequency corrector, in accordance with the frequency of a spectrum component of the stabilizing pulses selected by means of the initial oscillator tuning. Devices of this kind are described in detail in French patent specifications Nos. 939,510 and 971,862.

In practice it is required, in arrangements of the kind referred to, to stabilize the oscillator not only to frequencies corresponding to spectrum frequencies of the stabilizing pulses but also to frequencies lying midway between successive spectrum components.

For this purpose, according to the invention, the output circuit of the pulse mixing stage comprises a selective filter for selecting beat voltages of substantially equal frequencies between the oscillator voltage and different spectrum components of the stabilizing pulses; these beat voltages occurring at an oscillator frequency lying midway between spectrum components. The two beat voltages control a mixing stage operating as a phase detector, from the output circuit of which is taken the control-voltage supplied to the frequency corrector.

Use is preferably made of the beats produced in the pulse mixing stage between the oscillator voltage and adjacent spectrum components of the stabilizing pulses; the frequency of these beats corresponding, consequently, to half the pulse recurrence frequency. These beat frequencies may be selected from the spectrum of beat frequencies by using a circuit tuned to half the pulse recurrence frequency, or by using an integrating network comprising the parallel combination of a resistor and a capacitor. The network integrates the output pulses of the pulse mixing stage and suppresses frequencies exceeding half the pulse recurrence frequency.

In order that the invention may be more clearly understood and readily carried into effect, it will now be described more fully with reference to the accompanying drawing, in which the figure is a schematic diagram, partly in block form, of a superheterodyne receiver tunable to different communication frequencies embodying the circuit arrangement of the present invention.

In the figure, receiver 1 is a double superheterodyne receiver. The oscillations received through receiver aerial 2 control, via a tunable high-frequency preamplifier 3, a mixing stage 4, connected to a tunable first local oscillator 5. The intermediate frequency oscillations derived from the mixing stage 4 are supplied through a fixedly tuned first intermediate-frequency amplifier 6 to a second mixing stage 8. The second mixer stage 8 is connected to a fixedly tuned crystal-controlled second local oscillator 7, in order to produce the oscillations to be amplified in a fixedly tuned, second intermediate-frequency amplifier 9. A detector 10, connected to the second intermediate-frequency amplifier 9, produces demodulated oscillations which are supplied to a loudspeaker 12, via a low-frequency amplifier 11.

The receiver 1 is tunable in a range of, for example, 20 to 40 mc./s. in rough steps to frequencies lying midway between multiples of 1 mc./s.

The tuning of the receiver to a desired communication channel is carried out by tuning the first local oscillator 5 with an accuracy of about 20 to 80 kc./s. to the required frequency, for example, with the use of a pawl locking mechanism. After this automatic correction and stabilization of the oscillator 5 frequency is achieved by means of a frequency corrector 13, which may comprise, for example, a reactance tube. The frequency corrector 13 is controlled by a control-voltage from a control-voltage generator 14. A difference of, for example, 4 mc./s., corresponding to the first intermediate frequency of the receiver exists between the tuning frequency of the receiver, more particularly that of the high-frequency preamplifier 3, and the first local oscillator 5. If, consequently, the communication frequency to be received, is for example, 27.5 mc./s., the first local oscillator 5 of the receiver must furnish a frequency of 27.5—4=23.5 mc./s. Irrespective of the choice of the communication frequency in the given range of 20 to 40 mc./s., the first local oscillator 5 is stabilized with respect to control-frequencies by means of the control-voltage generator 14, which operates as follows.

A crystal-controlled pulse generator 15 furnishes short stabilizing pulses (duty-cycle at the most 1/50 to 1/100), having a recurrence frequency of 1 mc./s. These pulses are supplied to the control-grid of a pentode 17, normally cut off by a grid bias voltage source 16 and used as a pulse mixing stage. The oscillator voltage to be stabilized, of about 23.5 mc./s., is supplied, through a lead 18, to the suppressor grid of the mixing tube 17. Across the anode circuit of the mixing tube 17 occur beat frequencies between the oscillator 5 voltage and harmonics of the generator 15 is produced stabilizing pulses. Beat frequencies of about 0.5 mc./s. are produced by mixing the oscillator voltage with the 23 and 24 mc./s. harmonics of the stabilizing pulses, and beat frequencies of 1.5 mc./s. are produced by mixing said oscillator voltage with the 22 and 25 mc./s. harmonics of said pulses, and so forth.

The anode circuit of the pulse mixing stage 17 comprises an integrating network constituted by the parallel combination of a resistor 19 and a capacitor 20. The integrating network provides an unattenuated supply of the beat voltages of about 0.5 mc./s. to a diode push-pull mixing stage 22, connected to the anode circuit of the stage 17 through the capacitor 21. The network attenuates considerably, however, higher components of the spectrum of the beat frequencies.

If the oscillator frequency is initially, for example, 23.48 mc./s. instead of the desired 23.5 mc./s., beat voltages of 0.48 and 0.52 mc./s. respectively occur, which produce upon being mixed in the push-pull mixing stage 22, a control voltage of difference frequency of 0.04 mc./s. across an output resistor 23. This difference frequency control voltage is supplied to the frequency corrector 13 of the oscillator 5 through a control-voltage filter 24 and a lead 25, and produces a frequency modulation of the oscillator voltage. If, due to this frequency modulation, the oscillator 5 frequency reaches the desired value of 23.5 mc./s., the two beat voltages have a frequency of exactly 0.5 mc./s. and an alternating voltage no longer occurs across the output resistor 23. The mixing stage 22 then operates as a phase detector, so that a D. C. voltage occurs across the resistor 23. The polarity of this D. C. voltage varies with the phase difference between the two beat voltages, which in turn varies with the phase of the oscillator voltage, and is suitable for accurately locking the oscillator 5 frequency at the desired frequency of 23.5 mc./s.

If the phase of the oscillator voltage varies by $\varphi°$, the phase difference between the two beat voltages varies by $2\varphi°$. This on the one hand, is favorable to a great control-sensitivity, but on the other hand, however, reduces by half the holding range of the oscillator 5 (this is the maximum permissible detuning of the frequency determining circuit of the stibilized oscillator without interrupting the stabilization, which, of course, must be considered when proportioning the circuit arrangement.

If the oscillator 5 is tuned initially to, for example, 24.5 or 25.5 mc./s., and so on, automatic correction and locking of the oscillator frequency occurs at a frequency midway between successive spectrum components of the stabilizing pulses, in a manner similar to that described above.

The RC-network shown in the embodiment of the figure in the anode circuit of the pulse mixing stage 17, may, if desired, be replaced by a circuit or bandpass filter tuned to 0.5, 1.5, 2.5 mc./s., and so on. Instead of using the diode push-pull mixing stage for mixing the beat voltages, use may be made of any other suitable mixing stage, such as, for example, a mixing stage of the type used in the embodiment of the figure as a pulse mixing stage. However, the diode push-pull mixing stage has the advantage that one of the output terminals may be connected directly to ground, as is shown in the figure, and series capacitors to block differences in the direct voltage levels across the control-voltage lead may be dispensed with.

It is understood that the invention is not limited to the details disclosed but includes all such variations and modifications as fall within the spirit of the invention and the scope of the appended claims.

What I claim is:

1. A circuit arrangement comprising oscillator means for producing a first wave at a first given frequency value, frequency correction means coupled to said oscillator means, a source of pulse wave having a given pulse recurrence frequency value and having harmonic components at frequency values less than and greater than the said first given frequency value, means coupled to said oscillator means and said pulse source for producing a first beat voltage having a frequency equal to the difference between the frequencies of said first wave and a first of said harmonic components having a frequency less than said first given frequency value and for producing a second beat voltage having a frequency equal to the difference between the frequencies of said first wave and a second of said harmonic components having a frequency greater than said first given frequency value, said first and second harmonic components having frequency values at which said beat voltages have substantially equal frequency values, said beat voltage producing means comprising a mixing stage selectively conductive in response to said pulse wave and filter means coupled to said stage for selectively deriving therefrom said beat voltages, detector means for combining said first and second beat voltages thereby to produce a resultant signal having variations as determined by the instantaneous phase relationship of said beat voltages, and means for applying said resultant signal as a control signal to said frequency correction means.

2. A circuit-arrangement, as set forth in claim 1, wherein said filter comprises an integrating network including a resistor and a capacitor connected parallel thereto, said network integrating the output pulses of said mixing stage and suppressing beat frequencies exceeding half said pulse recurrence frequency.

3. A circuit-arrangement, as set forth in claim 1, wherein said detector means is constituted by a diode push-pull detector.

References Cited in the file of this patent

UNITED STATES PATENTS

| | | |
|---|---|---|
| 2,398,694 | Case | Apr. 16, 1946 |
| 2,463,685 | Fredendall | Mar. 8, 1949 |
| 2,476,840 | Colander | July 19, 1949 |
| 2,581,594 | MacSorley | Jan. 8, 1952 |
| 2,617,985 | Collins | Nov. 11, 1952 |